United States Patent
Subramanian et al.

(10) Patent No.: US 7,101,789 B2
(45) Date of Patent: Sep. 5, 2006

(54) METHOD OF WET ETCHING VIAS AND ARTICLES FORMED THEREBY

(75) Inventors: Kanakasabapathi Subramanian, Clifton Park, NY (US); Jeffrey Bernard Fortin, Niskayuna, NY (US); Wei-Cheng Tian, Clifton Park, NY (US)

(73) Assignee: General Electric Company, Niskayuna, NY (US)

(*) Notice: Subject to any disclaimer, the term of this patent is extended or adjusted under 35 U.S.C. 154(b) by 32 days.

(21) Appl. No.: 10/938,247

(22) Filed: Sep. 13, 2004

(65) Prior Publication Data

US 2006/0055048 A1    Mar. 16, 2006

(51) Int. Cl.
*H01L 21/44* (2006.01)

(52) U.S. Cl. ................... 438/637; 438/667

(58) Field of Classification Search ............... 257/774; 438/629, 637, 639, 640, 667, 668, 672, 675, 438/700, 701, 713, 978
See application file for complete search history.

(56) References Cited

U.S. PATENT DOCUMENTS

| | | | |
|---|---|---|---|
| 3,787,252 A | | 1/1974 | Filippazzi et al. |
| 4,797,715 A | * | 1/1989 | Thillays et al. ............... 257/81 |
| 4,863,560 A | * | 9/1989 | Hawkins ...................... 216/27 |
| 5,141,596 A | * | 8/1992 | Hawkins et al. ............... 216/2 |
| 6,221,769 B1 | | 4/2001 | Dhong et al. |
| 6,268,660 B1 | | 7/2001 | Dhong et al. |
| 6,660,564 B1 | | 12/2003 | Brady |
| 2002/0146200 A1 | | 10/2002 | Kudrle et al. |

FOREIGN PATENT DOCUMENTS

WO    WO 02/079853    10/2002

OTHER PUBLICATIONS

"Air-Isolated Through-Wafer Interconects for Microsystem Applications," D.F. Lemmerhirt et al., 0-7803-7731-1/2003 IEEE, pp. 1067-1070.
"Batch Fabrication of Through-Wafer Vias in CMOS Wafers for 3-D Packaging Applications," F. E. Rasmussen et al., 0-7803-7991 IEEE May 2003, pp. 634-639.
"Fabrication of High Aspect Ratio Through-Wafer Vias in CMOS Wafers for 3-D Packaging Applications," F. E. Rasmussen et al., 7803-7731 IEEE Jan. 2003, pp. 1659-1662.
"Fast Wet Anisotropic Etching of Si{100} and {100} with a Smooth Surface in Ultra-High Temperature KOH Solutions," Hiroshi Tanaka et al., 0-7803-7731 IEEE Jan. 2003, pp. 1675-1678.

(Continued)

*Primary Examiner*—Roy Potter
(74) *Attorney, Agent, or Firm*—William E. Powell, III; Donald S. Ingraham

(57) ABSTRACT

A method for forming smooth walled, prismatically-profiled through-wafer vias and articles formed through the method. An etch stop material is provided on a wafer, which may be a <110> silicon wafer. A mask material is provided on the etch stop material and patterned in such a way as to lead to the formation of vias that have at least one pair of opposing side walls that run parallel to a <111> plane in the wafer. A wet etchant, such as potassium hydroxide, is used to etch vias in the wafer. The use of a wet etchant leads to the formation of smooth side walls. This method allows an aspect ratio of height versus width of the vias of greater than 75 to 1.

19 Claims, 5 Drawing Sheets

OTHER PUBLICATIONS

"High Aspect Ratio Through-Wafer Interconnections for 3D-Microsystems," L. Wang et al., 0-7803-7744 IEEE Mar. 2003, pp. 634-637.

"Optimization of Bosch Etch Process for Through Wafer Interconnects," Linda Kenoyer et al., 0-7803-7972-1/2003 IEEE, pp. 338-339.

"Electrical Through-Wafer Interconnects with Sub-PicoFarad Parasitic Capacitance," C. H. Cheng et al., 0-7803-7224 IEEE Jul. 2002, pp. 18-21.

"Generic, Direct-Chip-Attach MEMS Packaging Design with High Density and Aspect Ratio through-Wafer Electrical Interconnect," Seong Joon Ok et al., 7803-7430 IEEE Apr. 2002, pp. 232-237.

"High Density, Aspect Ratio Through-Wafer Electrical Interconnect Vias for Low Cost, Generic Modular MEMS Packaging," Seong Joon Ok et al., 7803-7434 IEEE Jul. 2002, pp. 8-11.

"Process Compatible Polysilicon-Based Electrical Through-Wafer Interconnects in Silicon Substrates," E.M. Chow et al., 1057-7157/ IEEE Dec. 2002, pp. 631-640.

"Thermoelastically Actuated Acoustic Proximity Sensor with Integrated Through-Wafer Interconnects," V. Chandrasekaran et al., Solid-State Sensor, Actuator and Microsystems Workshop, Jun. 2-6, 2002, pp. 102-107.

"Volumetric Imaging Using 2D Capacitive Micromachined Ultrasonic Transducer Arrays (CMUTS): Initial Results," O. Oralkan et al., 0-7803-7582 IEEE Mar. 2002, pp. 1083-1086.

"Meniscus Interface Etching of Silicon in KOH in a Hands-on Introductory Course in MEMS," J. Schultz et al., 0-7803-6691 IEEE Mar. 2001, pp. 153-157.

"Modular, Device-Scale, Direct-Chip-Attach Packaging for Microsystems," Jordan Neysmith et al., 1521-3331 IEEE Dec. 2001, pp. 631-634.

"A High Aspect-Ratio Silicon Substrate-Via Technology and applications: Through-Wafer Interconnects for Power and Ground and Faraday Cages for SOC Isolation," Joyce J. Wu et al., 0-7803-6438 IEEE Apr. 2000, pp. 477-480.

"An Efficient Electrical Addressing Method Using Through-Wafer Vias for Two-Dimensional Ultrasonic Arrays," Ching H. Cheng et al., 0-7803-6365 IEEE May 2000, pp. 1179-1182.

"Etching Methodolgies in <111>-Oriented Silicon Wafers," R. Edwin Oosterbroek et al., 1057-7157-9/2000 IEEE, pp. 390-398.

"Silicon Membranes Manufactured by Electrochemical Etch Stop Technique," Paula Obreja et al., 0-7803-5139 IEEE Aug. 1999, pp. 531-534.

"Characterization of Anisotropic Etching Properties of Single-Crystal Silicon: Effects of KOH Concentration of Etching Profiles," Kazuo Sato et al., 0-7803-3744 IEEE Jan. 1997, pp. 406-411.

"KOH Wet Etchiing Techniques for the Micromachining of (100) SOI Wafers," M.A. Rosa., 0-7803-3374 IEEE Aug. 1997, pp. 454-457.

"(110) Silicon Etching for High Aspect Ratio Comb Structures," Seong-Hyok Kim et al., 0-7803-4192 IEEE Sep. 1997, pp. 248-252.

"Etch Rates for Micromachining Processing," Kirk R. Williams et al., 1057-7157 IEEE Dec. 1996, pp. 256-269.

"Mechanisms of Etch Hillock Formation," Song-sheng Tan et al., 1057-7157 IEEE Dec. 1996, pp. 66-72.

"Feasibility Study on Through-Wafers Interconnecting Method for Hybrid Wafer-Scale-Integration," Yuuji Fujita et al., 0569-5503 IEEE 1993, pp. 1081-1084.

"First Symposium of the Delft University Research Center of Intelligent Sensor Microsystems, DISens," May 21, 2002, pp. 1-69.

* cited by examiner

METHOD OF WET ETCHING VIAS AND ARTICLES FORMED THEREBY

BACKGROUND

The present disclosure relates generally to the field of micromachining techniques, and more particularly relates to a method for bulk forming through-wafer vias with a wet etchant.

Wet etching of silicon wafers with potassium hydroxide (KOH) is a well-known bulk micromachining technique. Wet etching as a micromachining technique provides a lower cost of manufacturing, since the etching can be done in batch processes and there is no need for expensive etching equipment, such as plasma etchers. The use of KOH for etching silicon wafers produces smooth side walls. KOH etching of <100> silicon wafers produces pyramidal shapes, i.e., the side walls of the vias are not parallel but instead incline relative to each other. The pyramidally-shaped openings through wafers have an enlarged footprint, thus lowering the upper limit of the number of openings that can be produced in the wafers and lowering the density of vias capable of being etched in a given footprint.

BRIEF DESCRIPTION

In one exemplary embodiment, there is provided a wafer that includes a wafer substrate having opposing surfaces and at least one through-wafer via connecting the opposing surfaces having an aspect ratio between height and width of greater than 75 to 1.

In one aspect, a semiconductor device is provided having a substrate and at least one via extending into the substrate and having an aspect ratio between height and width of greater than 75 to 1.

In another exemplary embodiment, there is provided a wafer including a wafer substrate and at least one through-wafer via having a prismatic profile and a smooth side wall.

In one aspect, a semiconductor device is provided having a substrate and at least one via having a prismatic profile and a smooth side wall.

In another exemplary embodiment, there is provided a method for forming prismatically-profiled through-wafer vias. The method includes applying an etch stop material to a wafer made of silicon, masking the etch stop material, and patterning openings in the etch stop material, wherein the patterning is such that at least two opposing edges of the openings run parallel to a <111> plane within the wafer. The method further includes applying wet etchant to the openings to form prismatically-profiled through-wafer vias.

DRAWINGS

DETAILED DESCRIPTION

Figure 1:
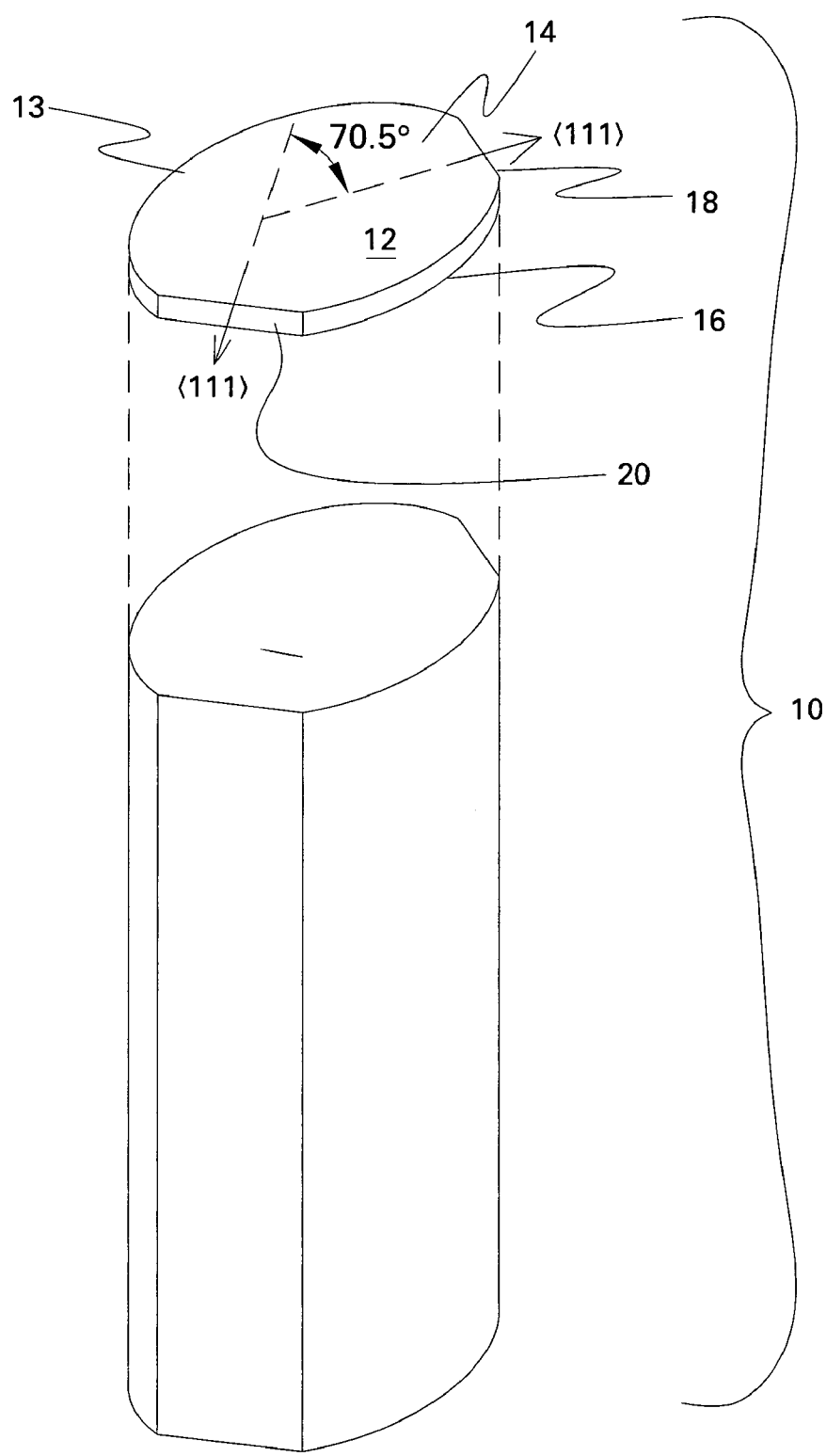
FIG. 1 is an exploded perspective view of a column of wafer material including a sliced wafer.
Figure 2:
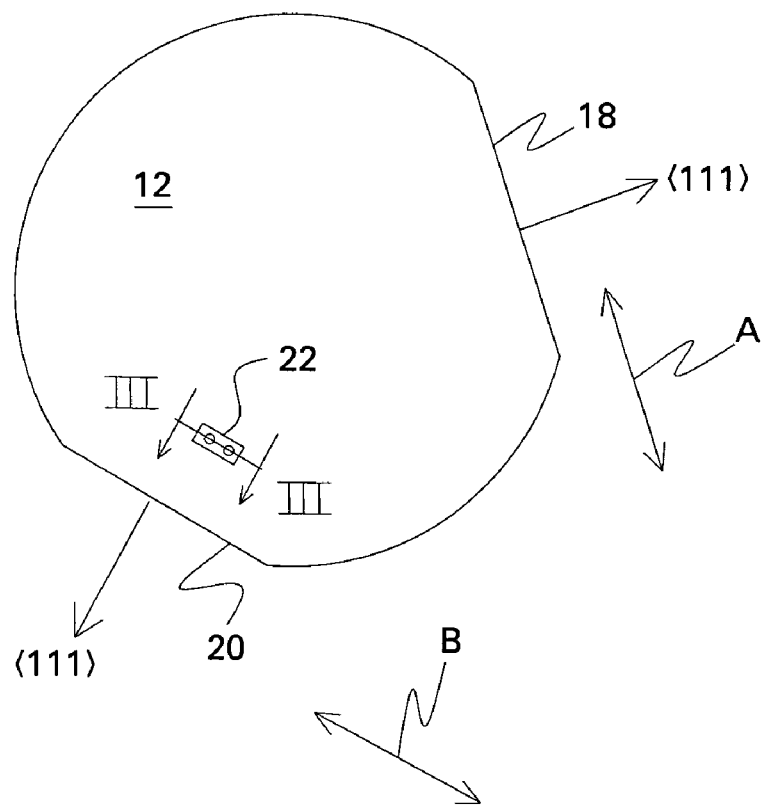
FIG. 2 is a top view of the sliced wafer of FIG. 1.
Figure 3:
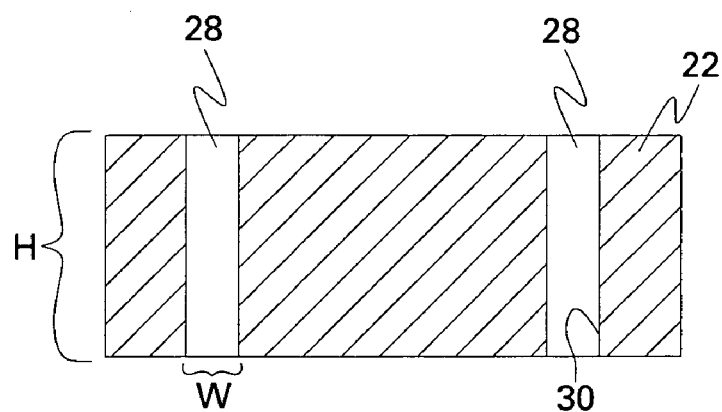
FIG. 3 is a cross-sectional view taken along line III—III of FIG. 2.

With reference to FIGS. 1–3, there is shown a <110> silicon wafer 12. A <110> silicon wafer includes two <111> planes therein. The wafer 12 is sliced from a column of wafer material 10. The illustrated wafer 12 includes a substrate 13 having opposing first and second surfaces 14 and 16. Optionally, a primary flat surface 18 and a secondary flat surface 20 may be formed on the column of wafer 10 (or on the individual wafer 12) to enable proper registration of devices, such as, for example, semiconductor or MEMS devices, that will eventually be diced out of the wafers 12. It should be appreciated that formation of the primary and secondary flat surfaces 18, 20 is optional, and only one of the flat surfaces or neither of the flat surfaces may be formed.

As shown, the primary flat surface 18 is formed such that it runs in a plane parallel to direction A (FIG. 2), which is perpendicular to one of the <111> planes in the wafer slice 12. Further, the secondary flat surface 20 runs in a direction parallel to direction B (FIG. 2), which is perpendicular to another of the <111> planes in the wafer slice 12. The two illustrated <111> planes in the wafer 12 form an angle 70.5° from each other.

Various electronic articles, such as, for example, semiconductor chips, can be formed from the wafer 12, by dicing them out of the wafer 12 and writing circuitry thereon. For illustrative purposes only, an area 22 is shown on the wafer 12. The area 22 is but one of numerous areas to be diced from the wafer 12. It should be appreciated that the size of area 22 is exaggerated in FIG. 2 for ease of illustration.

Certain devices that can be formed on areas, such as area 22, may require the formation of through-wafer vias to connect circuitry on opposing surfaces of the wafer. Examples of such devices include semiconductor chips. Other devices that can be formed on areas, such as area 22, may require the formation of through-wafer vias as mechanical or fluidic interconnects, such as MEMS devices such as pressure sensors, gas sensors, and microfluidic devices. With specific reference to FIG. 3, through-wafer vias 28 are shown extending from surface 14 to surface 16 in semiconductor area 22. Each through-wafer via 28 has a plurality of side walls 30. Through-wafer vias 28 have a height H the distance between the surfaces 14 and 16 and a width W between opposing side walls 30. By properly orienting the masking for semiconductor area 22 of a <110> wafer slice 12 parallel to directions A and/or B, a wet etchant, such as KOH, can be used to form the prismatically-shaped through-wafer vias 28, thereby allowing the width W to remain constant throughout the height H of the through-wafer vias 28.

Although prismatically-shaped through-wafer vias can be formed with a dry etchant, there are disadvantages to using a dry etchant. Dry etchant cannot be used to produce through-wafer vias in batch, but instead do so serially. Further, dry etching involves expensive equipment and the need for process gases. Also, the side walls, such as side wall 30, formed with a dry etchant are rougher than those formed by a wet etchant. Specifically, side walls formed with a wet etchant, such as KOH, have a mirror-like finish, with roughness on the order of only a few nanometers.

Figure 4A:
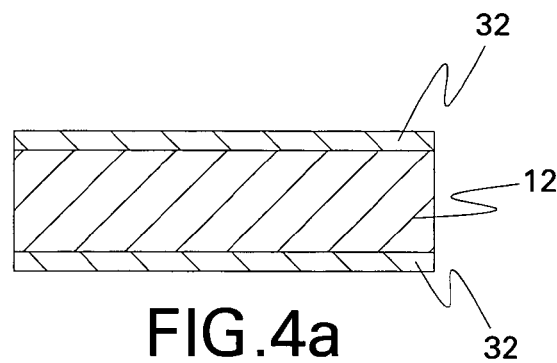
FIGS. 4a–4d are exemplary depictions of processing steps for forming a through-wafer via in accordance with an exemplary embodiment of the invention.
Figure 4B:
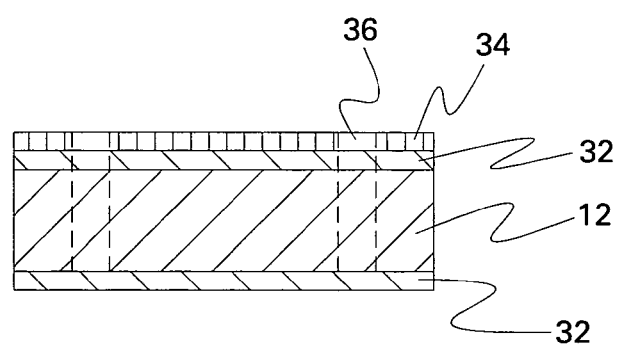

With specific reference to FIGS. 4a through 5, next will be described a process for forming through-wafer vias 28. The wafer 12 is coated on its surfaces with an etch stop material 32 at Step 100 (FIGS. 4a, 5). The etch stop material 32 should include a material that is insensitive to the wet etchant. For example, if the wet etchant is KOH, silicon nitride (SiN), silicon carbide (SiC), or various oxide materials, such as silicon dioxide ($SiO_2$) may be utilized as the etch stop material 32. At Step 105, a mask material 34 is applied to the etch stop material 32 (FIGS. 4b, 5). Any suitable masking technique may be used. For example, photo-resist material may be used, or alternatively, a shadow mask may be used as a mask and as a substitute for the etch stop material 32 itself.

At Step 110, openings 36 are patterned in the etch stop material 32 (FIGS. 4b, 5). The mask material 34 may be a photo-resist material. For a positive photo-resist material, the photo-resist material is developed and the etch stop material 32 beneath the exposed portion of photo-resist material is patterned. Conversely, for a negative photo-resist material, the photo-resist material is developed and the etch stop material 32 beneath the unexposed portion of photo-resist material is patterned. Alternative ways to pattern openings 36 may include using a laser according to a predetermined pattern, or using a shadow mask or a stencil formed of a material not sensitive to KOH as the mask material 34.

Figure 6:
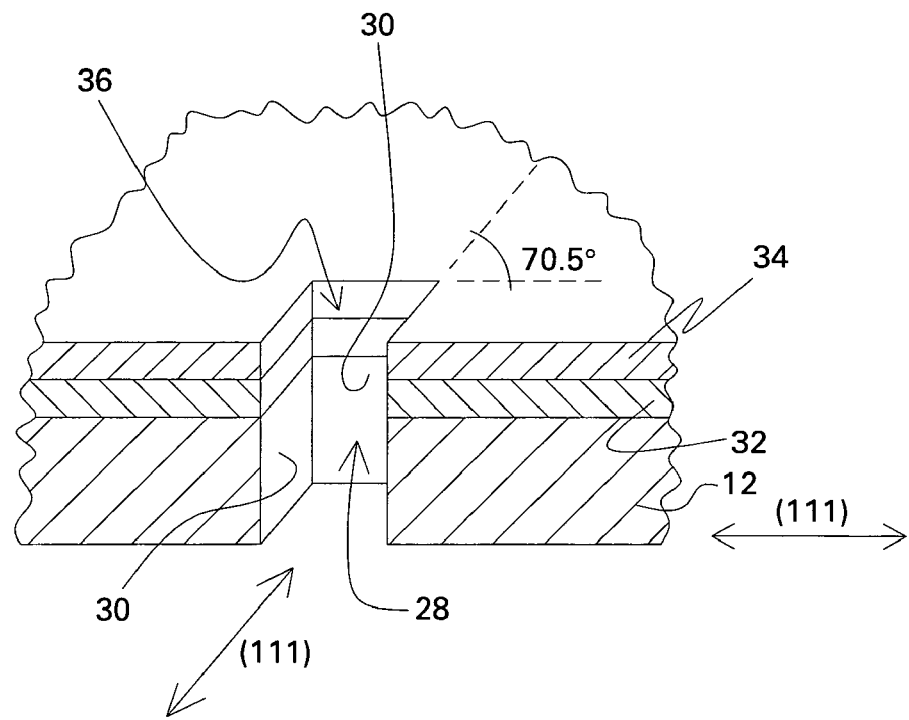
FIG. 6 is a partial perspective view illustrating the prismatic profile of a through-wafer via formed through the process steps of FIG. 5.

The openings 36 are patterned such that the vias 28 to be formed in a later step have a prismatic profile. As illustrated in FIG. 6, the mask material 34 should be patterned such that the edges of the openings 36 run parallel with at least one of the <111> planes within the wafer 12. This will ensure that the vias 28 later formed have a prismatic profile having at least two side walls 30 that are parallel to a <111> plane within the wafer 12. As shown in FIG. 6, the via 28 has four side walls 30, one pair parallel to a <111> plane and the other pair parallel to another <111> plane and at a 70.5° angle to the first pair. The mask material 34 is shown on the wafer 12 including the via 28 merely to illustrate how the patterning of the mask material 34 should be accomplished. It is to be understood that in practice the mask material 34 is removed prior to the formation of the vias 28.

Figure 4C:
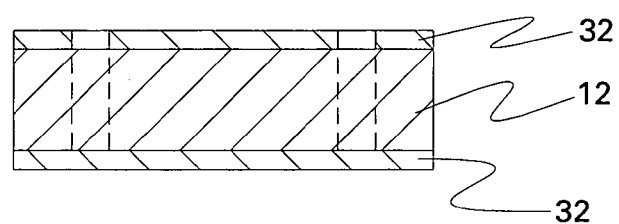
Figure 4D:
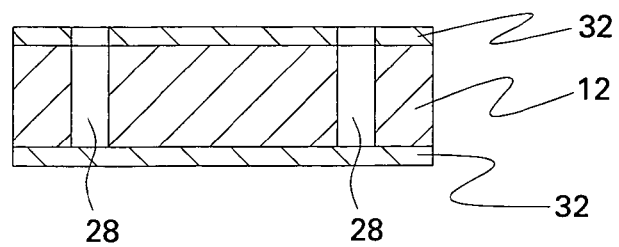
Figure 5:
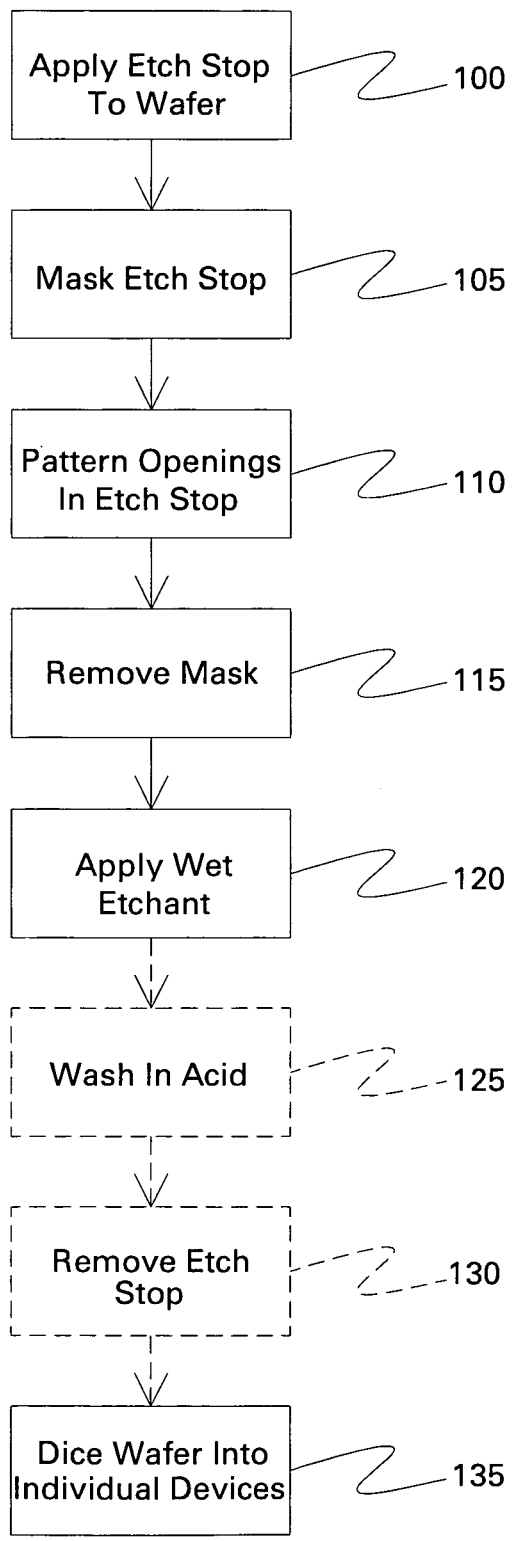
FIG. 5 illustrates steps for forming a through-wafer via in accordance with an exemplary embodiment of the invention.

At Step 115, the mask material 34 is removed, leaving openings 36 in the etch stop material 32 (FIGS. 4c, 5). After removal of the mask material 34, a wet etchant, such as KOH, is applied to the wafer 12 at Step 120. The application of the KOH may be accomplished in any suitable way, such as, for example, dipping the wafer 12 into the KOH. Due to the orientation of the patterning on the etch stop material 32, the KOH forms through-wafer vias 28 (FIGS. 4d, 5) having a prismatic profile. The prismatic profile ensures that a greater number of through-wafer vias 28 may be formed on any given wafer 12. The etching of patterns aligned to the <111> plane on <110> oriented wafers gives rise to a sidewall facet at the bottom of the via 28. The facet may be etched away by over-etching with KOH or by performing a short backside etch. Finally, at Step 135, the wafer 12 is diced into individual devices, such as, for example, semiconductor chips or pressure sensors.

Some optional steps may be incorporated into the method for forming through-wafer vias prior to the dicing Step 135. Specifically, at Step 125, the wafer 12 may be washed in a material to remove the KOH, such as, for example, water or an acid. Further, at Step 130, the etch stop material 32 may be removed from both surfaces 14, 16 of the wafer 12. And obviously, prior to Step 135, any necessary circuitry printing and filling of the vias 28 with a conductive material may be performed.

An advantage to forming through-wafer vias, with a wet etchant, having a prismatic profile is a greatly enhanced aspect ratio between the height H of the vias and the width W of the vias as compared with the aspect ratio possible through the use of a dry etchant. For example, while the use of dry etchant in special cases with carefully tailored recipes may lead to the formation of through-wafer vias having an aspect ratio (H/W) of 75:1, the use of wet etchant may provide an aspect ratio of greater than 75:1, and upwards of between about 100:1 and 250:1. Thus, through-wafer vias can be formed through embodiments of the invention having a smaller footprint than other known processes. Through-wafer vias having a smaller footprint translates into the ability to form greater numbers of such interconnects on a wafer.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while embodiments of the invention have been described with reference to the formation of vertical, prismatic vias in a <110> wafer, it should be appreciated that any crystalline material, including wafers with other than a <110> orientation, with a suitable crystal orientation-dependent etch may be used in the formation of vertical, prismatic vias. Further, it should be appreciated that ascertaining <111> planes is simpler in <110> wafers, but can be done in wafers having other than <110> orientations by using the etch rate differential between crystal planes to etch vertical vias. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A method for forming prismatically-profiled through-wafer vias, comprising:
    applying an etch stop material to a wafer comprised of silicon;
    masking the etch stop material;
    patterning openings in the etch stop material, wherein said patterning is such that at least two opposing edges of the openings run parallel to a <111> plane within the wafer; and
    applying wet etchant to the openings to form prismatically-profiled through-wafer vias.

2. The method of claim 1, wherein the etch stop material comprises silicon nitride.

3. The method of claim 1, wherein the etch stop material comprises silicon carbide.

4. The method of claim 1, wherein said masking comprises providing a shadow mask.

5. The method of claim 1, wherein said masking comprises providing a layer of photo-resist material on the etch stop material.

6. The method of claim 5, wherein said patterning comprises developing a portion of the photo-resist material.

7. The method of claim 1, wherein said patterning comprises lasing openings in the etch stop material.

8. The method of claim 1, wherein the wet etchant comprises potassium hydroxide.

9. The method of claim 8, wherein said applying wet etchant comprises dipping the wafer in the potassium hydroxide.

10. The method of claim 1, wherein said applying wet etchant comprises forming the prismatically-profiled through-wafer vias having smooth side walls and an aspect ratio of height to width of greater than 75 to 1 and less than about 250 to 1.

11. A method for forming prismatically-profiled through-wafer vias, comprising:
 applying an etch stop material to a silicon wafer;
 masking the etch stop material;
 patterning openings in the etch stop material, wherein said patterning is such that at least two opposing edges of the openings run parallel to a <111> plane within the wafer; and
 applying a wet etchant comprising potassium hydroxide to the openings to form prismatically-profiled through-wafer vias.

12. The method of claim 11, wherein the etch stop material comprises silicon nitride.

13. The method of claim 11, wherein the etch stop material comprises silicon carbide.

14. The method of claim 11, wherein said masking comprises providing a shadow mask.

15. The method of claim 11, wherein said masking comprises providing a layer of photo-resist material on the etch stop material.

16. The method of claim 15, wherein said patterning comprises developing a portion of the photo-resist material.

17. The method of claim 11, wherein said patterning comprises lasing openings in the etch stop material.

18. The method of claim 11, wherein said applying wet etchant comprises dipping the wafer in the potassium hydroxide.

19. The method of claim 11, wherein said applying wet etchant comprises forming the prismatically-profiled through-wafer vias having smooth side walls and an aspect ratio of height to width of greater than 75 to 1 and less than about 250 to 1.

* * * * *